(12) United States Patent
Teunissen et al.

(10) Patent No.: US 8,581,089 B2
(45) Date of Patent: Nov. 12, 2013

(54) MODULE HAVING A PLURALITY OF THERMOELECTRIC ELEMENTS

(75) Inventors: Ralph Teunissen, Deventer (NL); Albert Holger Ulland, Willich (DE)

(73) Assignee: O-Flexx Technologies GmbH, Duisburg (DE)

( * ) Notice: Subject to any disclaimer, the term of this patent is extended or adjusted under 35 U.S.C. 154(b) by 108 days.

(21) Appl. No.: 13/120,575

(22) PCT Filed: Jun. 8, 2010

(86) PCT No.: PCT/EP2010/057956
§ 371 (c)(1), (2), (4) Date: Mar. 23, 2011

(87) PCT Pub. No.: WO2011/003685
PCT Pub. Date: Jan. 13, 2011

(65) Prior Publication Data
US 2011/0174351 A1 Jul. 21, 2011

(30) Foreign Application Priority Data
Jul. 10, 2009 (DE) .......................... 10 2009 032 906

(51) Int. Cl.
*H01L 35/28* (2006.01)
(52) U.S. Cl.
USPC ............ 136/225; 136/211; 136/212; 136/224
(58) Field of Classification Search
USPC ........................... 136/225; 257/105, 110, 121
See application file for complete search history.

(56) References Cited

U.S. PATENT DOCUMENTS

| 4,081,895 A | 4/1978 | Germano et al. |
| 5,288,336 A * | 2/1994 | Strachan et al. ............... 136/200 |
| 6,894,215 B2 * | 5/2005 | Akiba ............................ 136/208 |
| 2003/0042497 A1 * | 3/2003 | Span ............................ 257/121 |
| 2007/0095381 A1 | 5/2007 | Lee |
| 2008/0173537 A1 * | 7/2008 | DeSteese et al. ........ 204/192.25 |
| 2008/0289677 A1 | 11/2008 | Bell et al. |

FOREIGN PATENT DOCUMENTS

| EP | 0 369 670 | 5/1990 |
| EP | 1 287 566 | 10/2003 |
| JP | 1 208876 | 8/1989 |

OTHER PUBLICATIONS

English Language Translation of the International Preliminary Report on Patentability issued Jan. 9, 2012 in PCT/EP2010/057956.

* cited by examiner

*Primary Examiner* — Jonathan Johnson
*Assistant Examiner* — Angelo Trivisonno
(74) *Attorney, Agent, or Firm* — Lucas & Mercanti, LLP

(57) ABSTRACT

A module having a plurality of thermoelectric elements electrically connected in series, each being made of at least one n-layer and at least one p-layer made of thermoelectric material with a pn-transition implemented along a boundary layer. A temperature gradient parallel to the boundary layer between a hot and a cold side of each thermoelectric element can be applied or detected. Resistances of the electrical contacts of the individual thermoelectric elements are reduced and the thermal connection to a heat sink or heat source is improved for generating a temperature gradient along the boundary layer. The substrate and the thermoelectric elements are produced in separate processes, and the thermoelectric elements are adhered to previously structured, thermally and electrically conductive regions of the substrate using different adhesives for the cold and hot side of each thermoelectric element.

9 Claims, 5 Drawing Sheets

Fig.1
a)
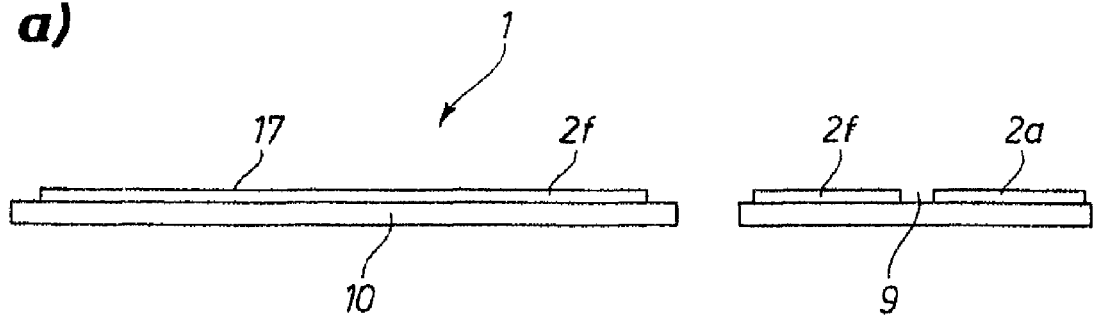
b)
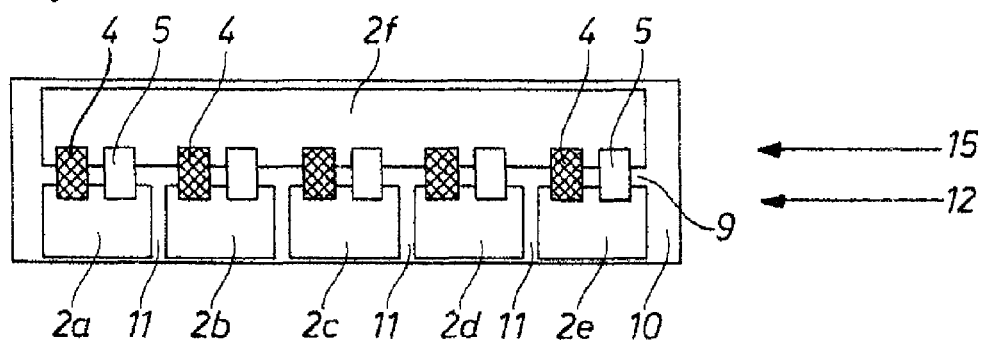
c)
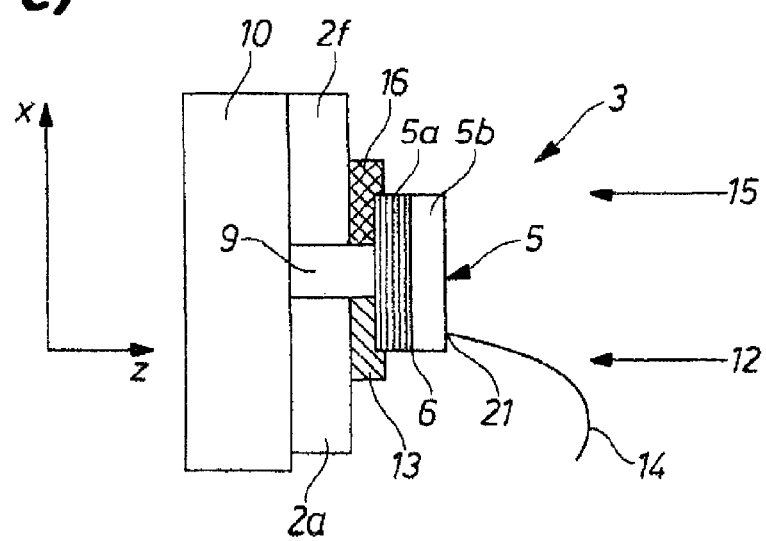

Fig. 3
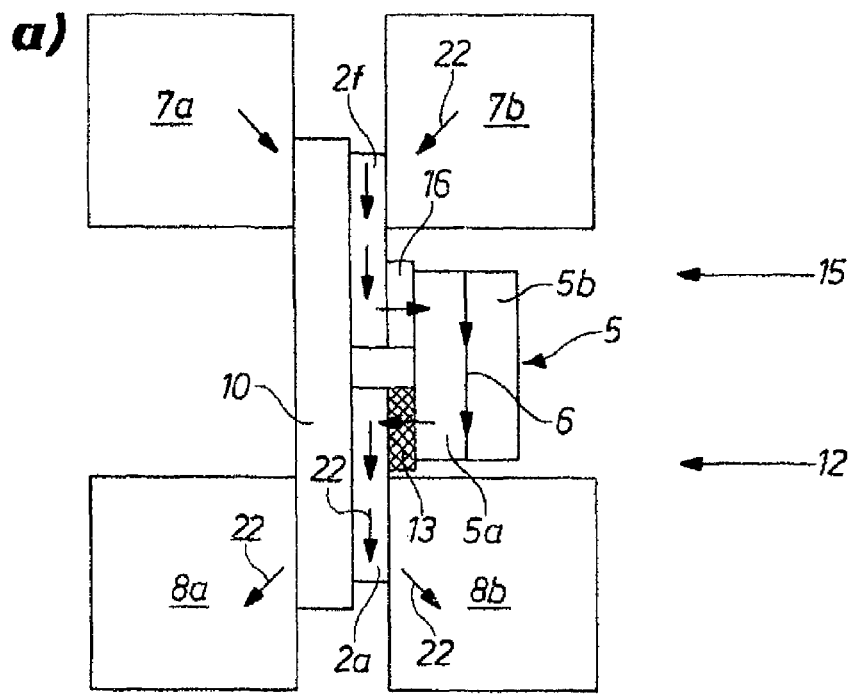
a)
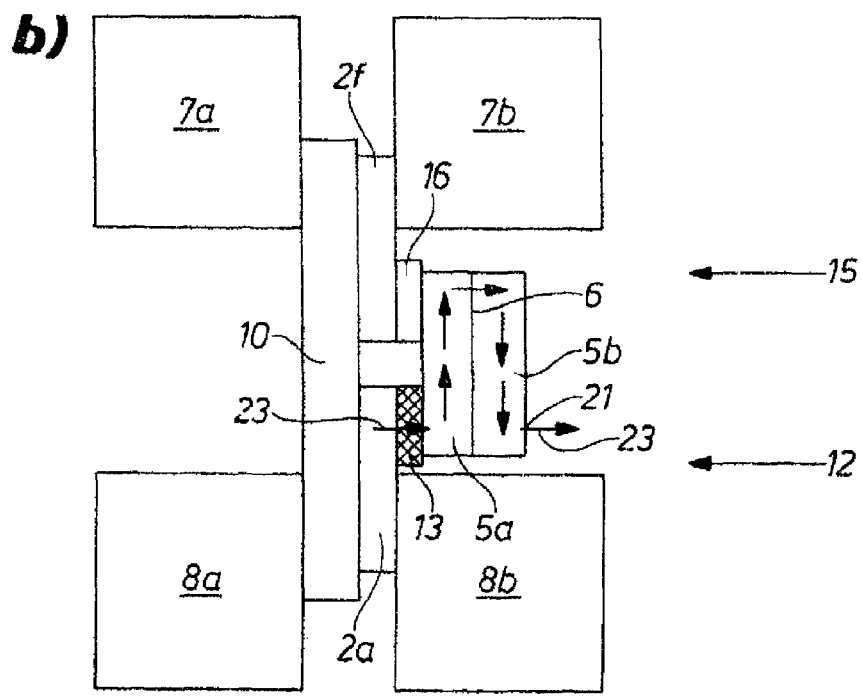
b)

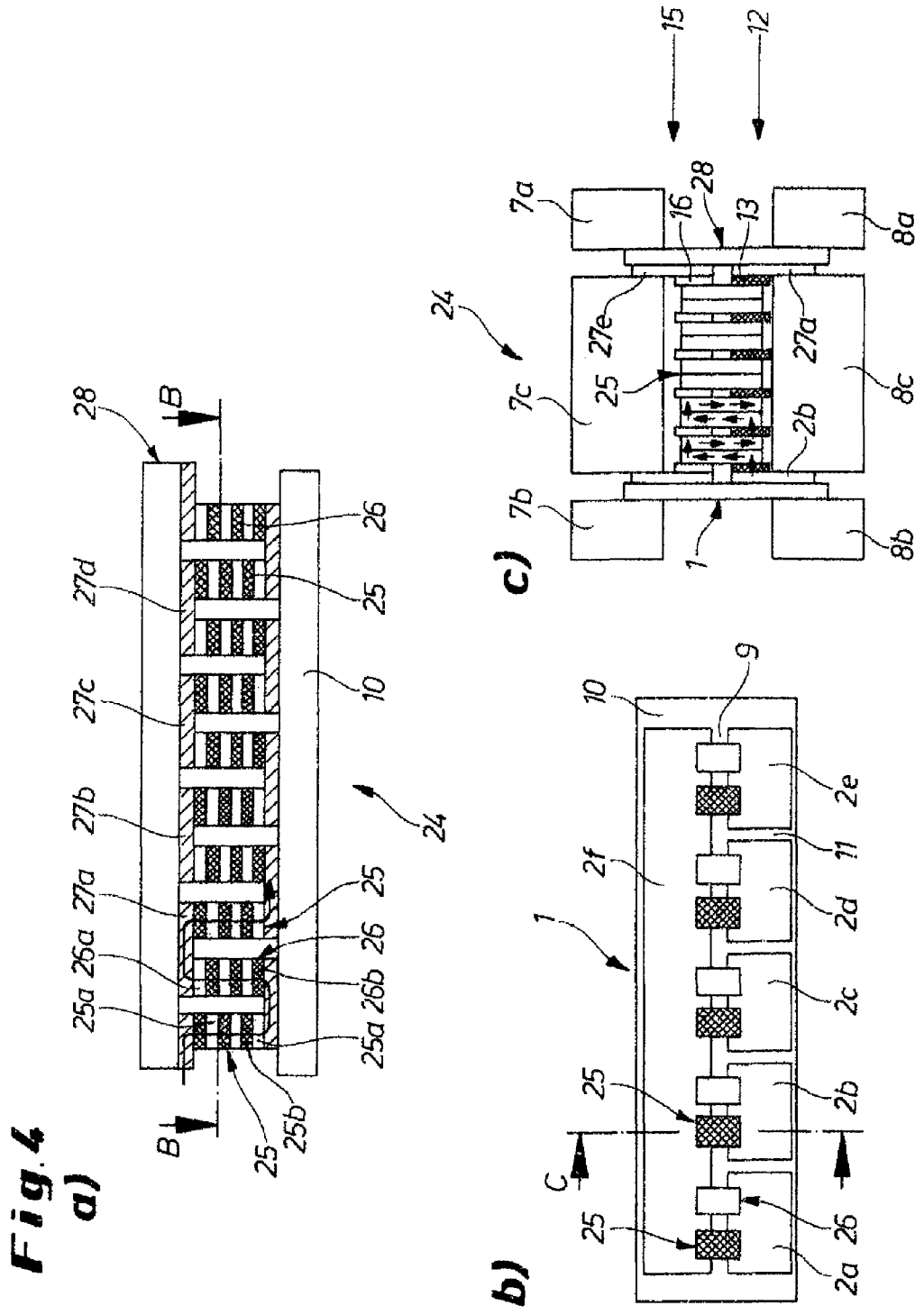

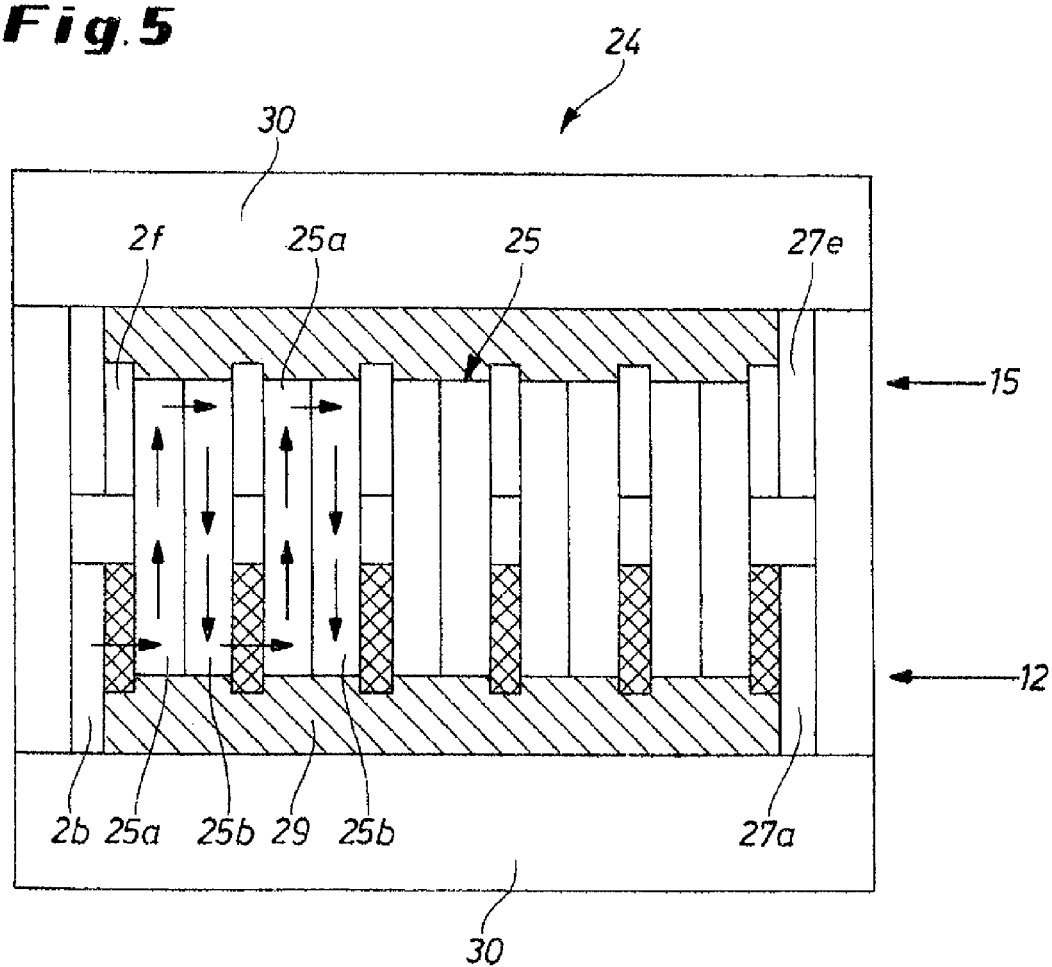

MODULE HAVING A PLURALITY OF THERMOELECTRIC ELEMENTS

PRIORITY CLAIM

This is a U.S. national stage of Application No. PCT/EP2010/057956, filed on Jun. 8, 2010, which claims priority to German Application No: 10 2009 032 906.4, filed: Jul. 10, 2009, the contents of which are incorporated herein by reference.

BACKGROUND OF THE INVENTION

1. Field of the Invention

The invention pertains to a module having several thermoelectric elements connected electrically in series, each of which consists of at least one n-layer and at least one p-layer of thermoelectric material, thus forming at least one pn-transition extending along a boundary layer, wherein a temperature gradient can be applied or detected between a hot side and a cold side of each thermoelectric element parallel to the boundary layer.

2. Related Art

The way in which thermoelectric elements work is based on the thermoelectric effect, referred to in the following as the Seebeck effect. The Seebeck effect involves the occurrence of an electrical voltage between two points of an electrical conductor or two differently doped semiconductors which are at different temperatures.

Heat can be converted directly into electrical energy by the use of a thermoelectric generator made up of several thermoelectric elements. The thermoelectric elements preferably are semiconductor materials doped in different ways, as a result of which the efficiency versus thermoelectric elements consisting of two different metals connected to each other at one end can be considerably increased. Commonly used semiconductor materials include $Bi_2Te_3$, PbTe, SiGe, BiSb, and $FeSi_2$. To obtain sufficiently high voltages, several thermoelectric elements are combined into a module and connected electrically in series.

To increase the efficiency of a thermoelectric generator, a module of the general type in question comprising several thermoelectric elements connected electrically in series is described in EP 1 287 566 B1, the disclosure of which, especially as it pertains to the design of the thermoelectric elements and their thermoelectric materials, is explicitly included in the present application. Each of the individual thermoelectric elements consists of at least one n-layer and at least one p-layer of thermoelectric material, thus forming at least one pn-transition extending along a boundary layer. A temperature gradient is applied between the n- and p-layers parallel to the boundary layer. The pn-transition is formed essentially along the entire, preferably the longest dimension of, the n-layer and p-layer and thus essentially along the entire boundary layer. As a result of the temperature gradient along the large pn-boundary surface, a temperature difference develops along this elongated pn-transition between the two ends of a p- and n-layer package, as a result of which the efficiency of the thermoelectric elements is higher than that found in the prior art, which does not comprise a temperature gradient along and inside the pn-transition.

SUMMARY OF THE INVENTION

One embodiment of the invention is a module which is advantageous in terms of production technology, in which the resistances of the electrical contacts between the individual thermoelectric elements is reduced, and in which the thermal connection of the thermoelectric elements to the heat sink or heat source for generating the temperature gradient along the boundary layer is improved.

A module of the type described above in that the module comprises a substrate with several electrically and thermally conductive areas, with separate insulating areas separating the thermally and electrically conductive areas from each other;

each thermoelectric element comprises an outward-facing p-layer and, on the opposite side, an outward-facing n-layer;

an outward-facing p-layer of a thermoelectric element is always connected in an electrically conductive manner to only one outward-facing n-layer of an adjacent thermoelectric element; and each pair of two adjacent thermoelectric elements is always connected electrically on the cold side to one of the electrically and thermally conductive areas of the substrate by a thermally and electrically conductive adherent layer.

An advantage associated with the production of the inventive module consists in that the thermoelectric elements can be produced independently of the substrate, that is, before the elements are connected to one of the electrically and thermally conductive areas of the substrate.

Producing the substrate separately from the thermoelectric elements makes it possible to mass-produce the inventive modules by a roll-to-roll process. Specifically, the thermoelectric elements are produced by chemical vapor deposition (CVD) of the different n- and p-doped thermoelectric materials (semiconductor materials). Alternatively, the thermoelectric elements are produced by physical vapor deposition (PVD). In contrast to the CVD process, the deposited thin layers are formed directly by condensation of the material vapor of the thermoelectric material.

The substrate is produced in particular by laminating a carrier material in the form of sheet material or especially of a strip with a layer of electrically and thermally conductive material such copper foil. The copper foil is then structured. The structuring is carried out by partial removal of the copper foil, so that the electrically and thermally conductive areas, which are separated thermally and electrically from each other by the insulating carrier material, are formed on the insulating carrier material. The carrier material is in particular a plastic selected from the group PI (polyimide), PA (polyamide), and PET (polyethylene terephthalate).

In one embodiment of the inventive module, the thermoelectric elements are connected electrically in series in that the outward-facing p-layer of one thermoelectric element is always connected electrically to only one outward-facing n-layer of an adjacent thermoelectric element, wherein the electrically and thermally conductive areas of the substrate establish the electrical contact of one thermoelectric element to only one other element. The additional electrical contact required between adjacent thermoelectric elements which are connected to separate electrically and thermally conductive areas of the substrate is accomplished via the outward-facing p- and n-layers facing away from the substrate with the help of an electrical conductor. The conductor can be adhesively bonded or soldered to the layers which are to be electrically connected to each other. It can take the form of wire, tape, or foil.

The secure fixation and good thermal and electrical connection of the thermoelectric elements to the substrate on the cold side is achieved by the thermally and electrically conductive adherent layer. This adherent layer is, for example, a single-component epoxy adhesive filled with conductive metal particles, or it can be designed as double-sided adhesive tape with conductive metal particles in an epoxy resin matrix.

On the hot side, adjacent thermoelectric elements are connected by a thermally conductive but electrically insulating adherent layer to a preferably continuous electrically and thermally conductive area on the substrate. This adherent layer can be a single-component epoxy adhesive, or it can be designed as double-sided adhesive tape. As a result, the thermoelectric elements are electrically contacted only on the cold side of the thermoelectric elements. A large portion of the heat flux flowing between the heat source on the hot side and the heat sink on the cold side flows through the thermoelectric elements, which convert the heat into electrical energy.

The electrically and thermally conductive areas on the preferably flexible, strip-shaped carrier material of the substrate are preferably separated electrically from each other by an insulating web that extends longitudinally and by several insulating webs that extend transversely to the longitudinal axis of the strip-shaped carrier material. On the hot side of the thermoelectric elements, preferably only one electrically and thermally conductive area is formed, namely, along one side of the longitudinal insulating web; this is the area which can be connected to the heat source. This uninterrupted area makes it possible to couple the heat uniformly into the thermoelectric elements, which are connected thermally in parallel. In addition, there is no need for the conductive area to be subjected to any structuring process, which makes it even easier to produce the module.

On the cold side of the thermoelectric element, namely, along one side of the longitudinal insulating web, the thermally and electrically conductive material is divided successively, preferably at regular intervals, into several thermally and electrically conductive areas by insulating webs extending transversely to the strip-shaped carrier material. The spacing of the insulating webs is selected so that two adjacent thermoelectric elements can be brought into contact on the cold side with one of the electrically and thermal conductive areas by the thermal and electrically conductive adherent layer.

So that the heat can be effectively coupled into the hot side of the thermoelectric elements and so that the heat can be carried away effectively on the cold side, one embodiment of the inventive module preferably comprises a heat sink and a heat source. The heat sink can be, for example, a cooling body. The heat source can be designed, for example, as a heat exchanger, which couples the waste heat of some other process into the module. To improve the transfer of heat between the module on the one side and the heat source or heat sink on the other, the outward-facing p- or p-layers of the thermoelectric elements only partially cover the electrically and thermally conductive areas of the substrate. The entire surface of the area left uncovered can then be brought into contact with the heat sink or the heat source.

So that the temperature gradient can be converted more effectively into electrical current, the thermoelectric elements preferably comprise two or more alternately arranged n- and p-layers. So that all the layers in a stack of this type are connected in a thermally effective manner and also so that adjacent thermoelectric elements which are connected to separate electrically and thermally conductive areas of the substrate can be connected electrically to each other, their outward-facing p- and n-layers facing away from the substrate are connected to each other by electrically conductive areas of an additional connecting substrate.

An advantageous method for producing an inventive module comprises the following steps:

producing a substrate by applying an electrically and thermally conductive layer to a carrier material of thermally and electrically insulating material; removing certain areas of the electrically and thermally conductive layer to form electrically and thermally conductive areas on the carrier material;

applying a thermally and electrically conductive adherent layer to the cold side of the thermoelectric elements produced independently of the substrate or preferably applying a thermally and electrically conductive adherent layer to the cold side of the substrate. The adherent layer must be applied to the thermally and electrically conductive areas of the substrate at least in the contact area of the thermoelectric elements on the cold side;

applying a thermally conductive but electrically insulating adherent layer to the hot side of each thermoelectric element or preferably applying a thermally conductive but electrically insulating adherent layer to the hot side of the substrate. The adherent layer being applied to each thermally and electrically conductive area of the substrate at least in the contact area of the thermoelectric element on the hot side;

connecting each pair of thermoelectric elements on the cold side by their outward-facing p- and n-layers to one of the electrically and thermally conductive areas of the substrate;

connecting the thermoelectric elements to at least one of the electrically and thermally conductive areas of the substrate on the hot side; and producing an electrical connection between two adjacent thermoelectric elements which are connected electrically to separate electrically and thermally conductive areas of the substrate via their outward-facing p- and n-layers facing away from the substrate.

BRIEF DESCRIPTION OF DRAWINGS

The invention is explained in greater detail below on the basis of exemplary embodiments:

FIG. 1a is a side view of a strip-shaped, flexible substrate of an inventive module according to one embodiment of the invention;

FIG. 1b is a top view of a partially fabricated module;

FIG. 1c is a side view of a completed module;

FIG. 3a is a side view of a module corresponding to FIG. 1c for the purpose of illustrating the heat flux;

FIG. 3b is a side view of a module corresponding to FIG. 1c for the purpose of illustrating the flow of current;

FIG. 4 is a second exemplary embodiment of an inventive module with thermoelectric elements, which are assembled from a plurality of alternatively arranged n- and p-layers; wherein FIG. 4a is a side view of the module;

FIG. 4b is a cross section through the module of FIG. 4a along line B-B; and

FIG. 4c is a cross section through the module along line C-C in FIG. 4b; and

FIG. 5 is a module according to FIG. 4, but here in a closed housing.

DETAILED DESCRIPTION OF DRAWINGS

Figure 2:
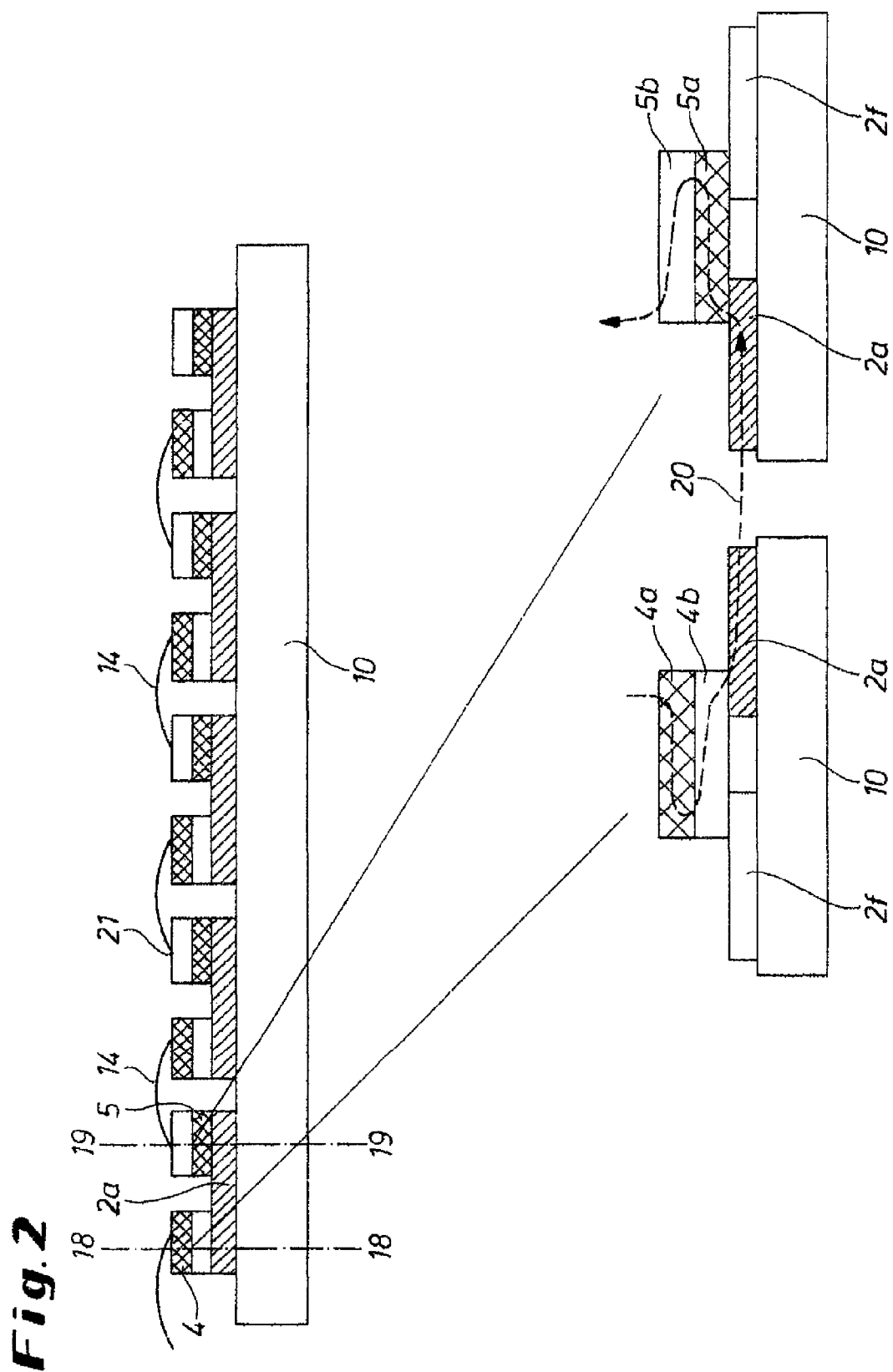
FIG. 2 is a side view of the module of FIG. 1b with indication of the flow of current.

The inventive module 3 consists essentially of a substrate 1 with several electrically and thermally conductive areas 2a-e and an electrically and thermally conductive area 2f on a carrier material 10. The electrically and thermally conductive areas are separated electrically from each other by an insulating web 9 extending longitudinally and by several webs 11 extending transversely to the web 9. In addition, the module 3 comprises a plurality of thermoelectric elements 4, 5, connected electrically in series, each of which has at least one n-layer 4a, 5a and at least one p-layer 4b, 5b of thermoelectric material.

The carrier material 10 is a sheet of PI, PA, or PET. The conductive areas 2a-f are copper. The n-layer and p-layer 4a, 5a, 4b, 5b of each thermoelectric element 4, 5 are formed from n-doped and p-doped semiconductor materials with good thermoelectric properties.

As can be seen especially clearly in FIG. 1c, the alternately arranged n- and p-layers 4a, 4b, 5a, 5b of each thermoelectric element 4, 5 lie against each other over their entire surfaces to form a boundary layer 6. Parallel to the boundary layer 6 (in the x-direction), a temperature gradient is applied between a heat source 7a, b and a heat sink 8a, b (see FIG. 3).

Precisely two thermoelectric elements 4, 5 are assigned to each of the electrically and thermally conductive areas 2a-e, wherein one of the thermoelectric elements is oriented so that its n-layer 5a, 4a faces the substrate 1, whereas the other thermoelectric element is oriented so that its p-layer 5b, 4b faces the substrate.

Each pair of two adjacent thermoelectric elements 4, 5 is connected electrically and thermally on the cold side 12 to one of the areas 2a-e of the substrate 1 by an adherent layer 13. Again on the cold side 12, adjacent thermoelectric elements 4, 5, which are connected to separate electrically and thermally conductive areas 2a-e, are connected electrically to each other on the opposite side, that is, via the outward-facing p-layer 4b, 5b and the outward-facing n-layer 4a, 5a facing away from the substrate 1, by an electrical conductor 14 (FIG. 2) in the form of a wire connection.

All of the thermoelectric elements 4, 5 are connected on their hot side 15 to the continuous conductive area 2f extending in the longitudinal direction of the substrate 1 by an adherent layer 16 with only thermal conductivity, especially by a thermally conductive plastic.

As can be seen especially clearly in the top view of FIG. 1b, all of the areas 2a-e are covered only partially by the thermoelectric elements 4, 5. The uncovered part of the area 2f extending toward the edge of the substrate 1 is clamped between the two components of the heat source 7a, b in a thermally conductive manner. On the cold side 12, the free parts of the conductive areas 2a-e are clamped between the two components of the heat sink 8a, b in a thermally conductive manner.

FIG. 2b, on the basis of a cross-sectional diagram along the lines 18, 19 through the module 3, illustrates the flow of current 20 that arises as a result of the temperature gradient in the two adjacent thermoelectric elements 4, 5 as a function of the doping of the semiconductors 4a, 4b; 5a, 5b.

FIG. 3a illustrates the heat flux 22 through the thermoelectric element 5 (compare line 19 according to FIG. 2). From the heat source 7a, 7b, the heat flux 22 passes into the thermally conductive copper area 2f and then proceeds via the thermally conductive adherent layer 16 to the hot side 15 of the thermoelectric element 5. From there, the heat flux 22 travels via the thermally and electrically conductive adherent layer 13 and the thermally and electrically conductive area 2a underneath that to the heat sink 8a, b on the cold side 12 of the thermoelectric element.

On the basis of the same thermoelectric element 5, FIG. 3b illustrates the flow of current 23 through the thermoelectric element 5 proceeding from the cold side 12. From the thermally and electrically conductive area 2a, the current passes via the thermally and electrically conductive adherent layer 13 into the n-layer 5a in the direction toward the hot side 15.

Via the boundary layer 6, the current flows back toward the cold side 12 of the thermoelectric element 5 to the contact 21 for the electrical conductor 14 leading to the adjacent thermoelectric element 4 separated by a web 9.

The module 24 according to FIG. 4 differs from the module 3 according to FIGS. 1-3 essentially with respect to the design of the thermoelectric elements 25, 26. In contrast to the thermoelectric elements 4,5, these do not consist here simply of an p-layer and a p-layer but rather of a stack of layers in which n- and p-layers 25a, b; 26a, b are arranged in alternation. The thermally and electrically conductive areas 2a-e and the continuous area 2f are arranged on the carrier material 10 in the same way as before.

Two adjacent thermoelectric elements 25, 26 which are connected to separate electrically and thermally conductive areas 2a-3 of the substrate are connected electrically to each other, as before, via the outward-facing p-layer 25a, 26b and the outward-facing n-layer 26a, 26b facing away from the substrate 1; in contrast to the exemplary embodiment according to FIGS. 1-3, however, they are connected here by electrically conductive areas 27a-d of a connecting substrate 28. The connecting substrate 28 can be designed and produced in the same way as the substrate 1. It is advantageous in particular for the electrically conductive areas 27a-d to have good thermal conductivity also, which can be done by making them of copper, for example.

The connecting substrate 28 comprises another electrically conductive area 27e, which is connected only thermally to the thermoelectric elements 25, 26 on the hot side 15. For the connection of the substrate 28 to the thermoelectric elements 25, 26, thermally and electrically conductive adherent layers 13 are used again on the cold side 12, whereas, on the hot side 15, adherent layers 16 with only thermal conductivity are used.

In the exemplary embodiment of the module 24, both the heat sink 8 and the heat source 7 of the module 24 according to FIG. 4 comprise third parts 7c and 8c, which are arranged between the substrates 1 and 28, one extending along the cold side 12, the other along the hot side 15 of the thermoelectric elements 25, 26.

FIG. 5 shows a module 24 corresponding to FIG. 4, in which the heat sink and the heat source are made of a thermally conductive but electrically insulating casting compound 29, which rests in one case against the cold side 12 of each thermoelectric element 25, 26 and in the other case against the hot side 15 of each thermoelectric element 25, 26 and also against the electrically and thermally conductive areas 2a-f, 27a-e. For the sake of mechanical stabilization, the module 24 can be installed in a housing 30.

The substrate 1 and the thermoelectric elements 4, 5 are produced separately from each other by independent processes. First, a layer 17, especially of copper, is applied over the entire surface of the carrier material 10 of the substrate 1. By removing the layer 17 of copper along the intended course of the webs 9, 11, the required surface structure of the substrate 1 with several electrically and thermally conductive areas 2a-f is produced, which separate the insulating areas along the webs 9, 11 from each other. The webs consist of a carrier material 10, especially a carrier material of plastic.

Then the adherent layer 13 is applied on the cold side 12 to the surface of each of the thermoelectric elements 4, 5 facing the substrate 1, whereas, on the hot side 15, the adherent layer 16 is applied, both of these applications being performed before the thermoelectric elements 4, 5 are bonded in pairs to their assigned areas 2a-e and to the area 2f on the hot side. Alternatively, the adherent layers 13, 16 are applied to the cold and hot sides 12, 15 of the substrate 1 before the thermoelectric elements 4, 5 are bonded in pairs to their assigned the areas 2a-e on the cold side 12 and to the area 2f on the hot side 15.

The electrical conductor 14 is attached as the last step; specifically, it is bonded in place with an adhesive or soldered on the cold side 12 between adjacent thermoelectric elements 4, 5 which are separated from each other by a web 11.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A module comprising:
   a substrate having a plurality of electrically and thermally conductive areas and a plurality of insulating areas configured to thermally and electrically separate the plurality of electrically and thermally conductive areas from each other;
   a plurality of thermoelectric elements arranged on the substrate and connected electrically in series, each of the plurality of thermoelectric elements comprises:
   at least one n-layer of thermoelectric material arranged on and directly contacting a p-layer of thermoelectric material disposed between the n-layer and the substrate, or at least one p-layer of thermoelectric material arranged on and directly contacting an n-layer of thermoelectric material disposed between the p-layer and the substrate,
   wherein adjacently positioned thermoelectric elements have alternatingly arranged layer structures relative to each other with respect to the n-layer and p-layer of each thermoelectric element,
   wherein a respective p-layer of a respective thermoelectric element is always connected electrically to only one n-layer of only one adjacent thermoelectric element; and
   a first thermally and electrically conductive adherent layer configured to connect at least one pair of two adjacently positioned thermoelectric elements electrically on a cold side of the thermoelectric element to one of the plurality of electrically and thermally conductive areas of the substrate; and
   a second thermally conductive and electrically insulating adherent layer configured to connect the at least one pair of two adjacently positioned thermoelectric elements on a hot side of the thermoelectric element to at least one of the plurality of electrically and thermally conductive areas of the substrate,
   wherein a temperature gradient parallel to a boundary layer contacting surface between the n-layer and p-layer of each of the plurality of thermoelectric elements can be applied or detected between a hot side and a cold side of each of the plurality of thermoelectric elements.

2. The module according to claim 1, wherein two adjacently positioned thermoelectric elements that are connected to separate instances of the plurality of electrically and thermally conductive areas of the substrate are connected to each other by an electrical conductor via their respective p-layer of thermoelectric material and n-layer of thermoelectric material positioned farthest away from the substrate.

3. The module according to claim 1, wherein the p-layers and n-layers positioned farthest away from the substrate only partially cover the plurality of electrically and thermally conductive areas.

4. The module according to claim 1, further comprising at least one heat sink connected to the plurality of electrically and thermally conductive areas that is connected in a thermally conductive manner on the cold side of the module.

5. The module according to claim 1, further comprising at least one heat source connected in a thermally conductive manner to the at least one of the plurality of electrically and thermally conductive areas on the hot side of the module.

6. The module according to claim 1, wherein the substrate comprises a flexible, strip-shaped carrier material.

7. The module according to claim 6, further comprising at least one insulating web extending longitudinally and a plurality of insulating webs extending transversely to the strip-shaped carrier material configured to separate the respective plurality of electrically and thermally conductive areas from each other.

8. The module according to claim 7, wherein two adjacently positioned thermoelectric elements, which are connected to separate instances of the plurality of electrically and thermally conductive areas of the substrate, are connected to each other via their respective p-layer and n-layer positioned farthest away from the substrate by at least one electrically conductive areas of a connecting substrate.

9. The module according to claim 2, wherein the two adjacently positioned thermoelectric elements, which are connected to separate instances of the plurality of electrically and thermally conductive areas of the substrate, are connected to each other via their respective p-layer and n-layer positioned farthest away from the substrate by at least one electrically conductive areas of a connecting substrate.

* * * * *